(12) United States Patent
Iwashita et al.

(10) Patent No.: US 9,708,533 B2
(45) Date of Patent: Jul. 18, 2017

(54) WAVELENGTH CONVERSION MEMBER AND LIGHT-EMITTING DEVICE EMPLOYING SAME

(71) Applicant: Ube Industries, Ltd., Ube-shi (JP)

(72) Inventors: Kazuki Iwashita, Ube (JP); Takuma Sakai, Ube (JP); Takayuki Ueda, Ube (JP); Masataka Fujinaga, Ube (JP); Shinsuke Jida, Ube (JP); Masataka Yamanaga, Ube (JP); Yuki Nagao, Ube (JP); Takafumi Kawano, Ube (JP)

(73) Assignee: Ube Industries, Ltd. (JP)

( * ) Notice: Subject to any disclaimer, the term of this patent is extended or adjusted under 35 U.S.C. 154(b) by 146 days.

(21) Appl. No.: 14/436,224

(22) PCT Filed: Oct. 17, 2013

(86) PCT No.: PCT/JP2013/078219
§ 371 (c)(1),
(2) Date: Apr. 16, 2015

(87) PCT Pub. No.: WO2014/061748
PCT Pub. Date: Apr. 24, 2014

(65) Prior Publication Data
US 2015/0247086 A1 Sep. 3, 2015

(30) Foreign Application Priority Data
Oct. 17, 2012 (JP) ................. 2012-229372

(51) Int. Cl.
| C09K 11/64 | (2006.01) |
|---|---|
| H01L 33/50 | (2010.01) |
| C09K 11/77 | (2006.01) |
| F21V 9/16 | (2006.01) |
| C04B 35/597 | (2006.01) |
| C04B 35/626 | (2006.01) |
| C09K 11/08 | (2006.01) |
| C04B 35/645 | (2006.01) |
| F21K 9/64 | (2016.01) |

(52) U.S. Cl.
CPC ........ *C09K 11/7734* (2013.01); *C04B 35/597* (2013.01); *C04B 35/6265* (2013.01); *C04B 35/645* (2013.01); *C09K 11/0883* (2013.01); *F21K 9/64* (2016.08); *F21V 9/16* (2013.01); *C04B 2235/3852* (2013.01); *C04B 2235/3865* (2013.01); *C04B 2235/3873* (2013.01); *C04B 2235/3895* (2013.01); *C04B 2235/5409* (2013.01); *C04B 2235/77* (2013.01); *C04B 2235/80* (2013.01); *H01L 33/502* (2013.01)

(58) Field of Classification Search
CPC ........... C09K 11/7734; C04B 2111/807; C04B 35/6268; C04B 2235/3873; C04B 2235/3878; C04B 2235/5409
See application file for complete search history.

(56) References Cited

U.S. PATENT DOCUMENTS

| 8,125,129 B2 * | 2/2012 | Maurer .................. B02C 19/18 |
|---|---|---|
| | | 241/1 |
| 2008/0309220 A1 | 12/2008 | Sakata et al. |
| 2010/0208481 A1 | 8/2010 | Miyake et al. |

FOREIGN PATENT DOCUMENTS

| JP | 2003-258308 A | 9/2003 |
|---|---|---|
| JP | 2004-238505 A | 8/2004 |
| JP | 2005-307012 A | 11/2005 |
| JP | 2009-510757 A | 3/2009 |
| JP | 2009-096883 A | 5/2009 |
| JP | 2010-027704 A | 2/2010 |
| JP | 2010-538102 A | 12/2010 |
| JP | 2012-224757 A | 11/2012 |
| WO | 2007/036875 A2 | 4/2007 |
| WO | 2009/031089 A1 | 3/2009 |
| WO | 2012/098932 A1 | 7/2012 |
| WO | 2013/054901 A1 | 4/2013 |

OTHER PUBLICATIONS

Choi et al, "Luminescence Properties of Eu2+-Doped Ca-alpha-SiAlON Synthesized by Spark Plasma Sintering".*
Rong-Jun Xie et al., "Optical Properties of $Eu^{2+}$ in α-SiAlON," J. Phys. Chem. B, vol. 108, 2004, pp. 12027-12031.
Yang Jian-Jun et al., "The crystal structure and luminescent properties of nitrogen-rich Ca-α-sialon: Eu with saturated calcium solubility fabricated by the alloy-nitridation method," Chin. Phys. B, vol. 21, No. 7, 2012, pp. 077802-1-077802-8.
Supplementary European Search Report dated May 11, 2016, of corresponding European Application No. 13846503.4.
Choi, S., et al., "Luminescence Properties of Eu[sup 2+]-Doped Ca-[alpha]-SiAlON Synthesized by Spark Plasma Sintering," *Journal of the Electrochemical Society*, vol. 157, No. 8, Jun. 29, 2010, p. J299.

* cited by examiner

*Primary Examiner* — Carol M Koslow
(74) *Attorney, Agent, or Firm* — DLA Piper LLP (US)

(57) ABSTRACT

A method of manufacturing a wavelength conversion member including a polycrystalline ceramics includes mixing a substance serving as a silicon source, a substance serving as an aluminum source, a substance serving as a calcium source, and a substance serving as a europium source; firing the obtained mixture to obtain an oxynitride phosphor powder; then sintering the oxynitride phosphor powder in an inert atmosphere to obtain the polycrystalline ceramics, characterized in that the sintered oxynitride phosphor powder has a composition (excluding oxygen) represented by the Formula: $Ca_{x1}Eu_{x2}Si_{12-(y+z)}Al_{(y+z)}O_zN_{16-z}$ (in the Formula, x1, x2, y, and z are values such that $0 < x1 \leq 3.40$, $0.05 \leq x2 \leq 0.20$, $3.5 \leq y \leq 7.0$, $0 \leq z \leq 1$).

15 Claims, 1 Drawing Sheet

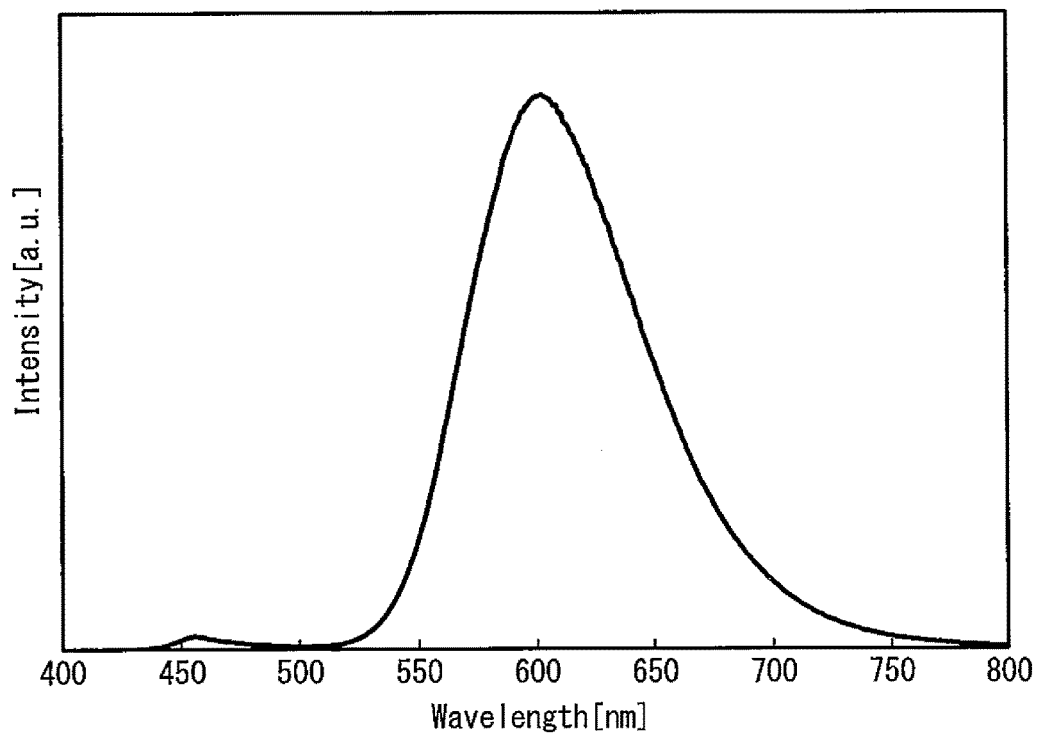

WAVELENGTH CONVERSION MEMBER AND LIGHT-EMITTING DEVICE EMPLOYING SAME

TECHNICAL FIELD

The present invention relates to a wavelength conversion member, a production method thereof, and a light-emitting device fabricated by combining a wavelength conversion member and a semiconductor light-emitting element. More specifically, the present invention relates to a wavelength conversion member composed of polycrystalline ceramics having an orange emission color, a production method thereof, and a light-emitting device fabricated by combining the wavelength conversion member having an orange emission color with a semiconductor light-emitting element having a violet-to-blue emission color.

BACKGROUND ART

In recent years, a white LED fabricated by combining a blue light-emitting diode, such as GaN, with a wavelength conversion member has come into widespread use. The wavelength conversion member is generally a phosphor particle, and a member obtained by dispersing phosphor particles in a resin is used. However, the wavelength conversion member obtained by dispersing phosphor particles in a resin has drawbacks, such as insufficient durability, due to heat resistance, etc., of the resin.

On the other hand, as in Patent Document 1, a wavelength conversion member obtained by dispersing a phosphor powder in glass has also been developed as the wavelength conversion member. Furthermore, as described in Patent Document 2, an attempt to use polycrystalline ceramics as the wavelength conversion member is also being made.

The wavelength conversion member obtained by dispersing a phosphor powder in glass or the polycrystalline ceramics phosphor material is an aluminum.garnet-based phosphor using Ce as an activator (YAG:Ce phosphor), and these techniques are related to developing a pseudo-white light-emitting device in which a blue emission color of a blue light-emitting diode and a yellow emission color of a YAG:Ce phosphor are combined.

In addition, with regard to a light-emitting device other than pseudo-white LED, as described in Patent Document 3, it is being attempted as well to use a semiconductor light-emitting element as the light source for a vehicular marker lamp, and a wavelength conversion member having an orange-to-red emission color is also required as the wavelength conversion member.

As disclosed in Patent Documents 4 and 5, using a phosphor material composed of polycrystalline ceramics as the wavelength conversion member having an orange-to-red emission color is also being attempted. However, whether the wavelength conversion members described in Patent Documents 4 and 5 have a luminescence intensity of a practical level and can achieve a wavelength control to obtain target chromaticity is unknown, and moreover, it is difficult to say that the production conditions are sufficiently studied.

PRIOR ART

Patent Document

[Patent Document 1] Japanese Unexamined Patent Publication (Kokai) No. 2003-258308

[Patent Document 2] Japanese Unexamined Patent Publication (Kokai) No. 2010-27704

[Patent Document 3] Japanese Unexamined Patent Publication (Kokai) No. 2009-96883

[Patent Document 4] National Publication of Translated Version (Kohyo) No. 2009-510757

[Patent Document 5] Japanese Unexamined Patent Publication (Kokai) No. 2010-538102

SUMMARY OF THE INVENTION

Problems to be Solved by the Invention

A wavelength conversion member having high luminance worthy of practical use and excellent durability is demanded so as to obtain orange-to-red luminescence at a desired wavelength. However, as described above, a wavelength conversion member having high efficiency worthy of practical use and excellent durability is not known.

An object of the present invention is to provide a wavelength conversion member having a fluorescence peak wavelength of 590 to 610 nm wherein the wavelength conversion member has more excellent durability and higher efficiency than ever before, and a light-emitting device fabricated by combining the wavelength conversion member and a semiconductor light-emitting element.

Means to Solve the Problems

As a result of intensive studies to solve the above-described problems, the present inventors have found that a wavelength conversion member composed of polycrystalline ceramics obtained by sintering a specific oxynitride phosphor powder that is produced by mixing a substance serving as a silicone source, a substance serving as an aluminum source, a substance serving as a calcium source, and a substance serving as a europium source so as to contain excess oxygen relative to a composition represented by composition formula (1):

$$Ca_{x1}Eu_{x2}Si_{12-(y+z)}Al_{(y+z)}O_zN_{16-z} \quad (1)$$

(wherein x1, x2, y and z are $0<x1\leq3.40$, $0.05\leq x2\leq0.20$, $3.5<y\leq7.0$ and $0\leq z\leq1$) and firing the mixture, emits fluorescence having a peak wavelength in a broad wavelength region of 590 to 610 nm when excited by light at a wavelength of 300 to 500 nm and the conversion efficiency thereof is high. The present invention has been achieved based on this finding.

That is, the present invention relates to a method of producing a wavelength conversion member composed of polycrystalline ceramics, comprising:

A) mixing a substance serving as a silicon source, a substance serving as an aluminum source, a substance serving as a calcium source, and a substance serving as a europium source, B) firing the obtained mixture to obtain an (oxy)nitride phosphor powder, and C) sintering the (oxy)nitride phosphor powder obtained in the firing step B) to obtain polycrystalline ceramics, said polycrystalline ceramics comprising an α-sialon crystal phase and an aluminum nitride crystal phase, wherein the oxynitride phosphor powder sintered in step C) comprises Ca, Eu, Si, Al, N and O with a ratio of said Ca, Eu, Si, Al and N being a ratio of Ca, Eu, Si, Al and N in an (oxy)nitride phosphor represented by composition formula (1):

$$Ca_{x1}Eu_{x2}Si_{12-(y+z)}Al_{(y+z)}O_zN_{16-z} \quad (1)$$

wherein x1, x2, y and z are
0<x1≤3.40,
0.05≤x2≤0.20,
3.5<y≤7.0, and
0≤z≤1,
the oxygen content of the oxynitride phosphor powder being in excess of the theoretical oxygen content of the (oxy)nitride phosphor represented by composition formula (1), the excess oxygen amount being from 1.1 to 11.5 mass % with respect to 100 mass % of the theoretical mass of the (oxy)nitride phosphor represented by composition formula (1).

In the present specification, "(oxy)nitride phosphor" is sometimes referred to as "oxynitride".

The method of producing a wavelength conversion member according to the present invention preferably has either one or both of D) a step of preliminarily adjusting the oxygen content in at least one the substance serving as a silicon source, the substance serving as an aluminum source, the substance serving as a calcium source, and the substance serving as a europium source used in the step A), which constitute the mixture, wherein the composition of the mixture is such that the oxynitride phosphor powder obtained by firing the mixture in an inert atmosphere has a composition represented by composition formula (1) except for that the oxygen content thereof is in excess of the theoretical oxygen amount of the (oxy)nitride phosphor represented by composition formula (1), and E) an oxidation step of, after the firing step B), heat-treating the (oxy)nitride phosphor powder obtained in the firing step B) at 800 to 1,200° C. in an oxygen-containing atmosphere to increase the oxygen amount in the oxynitride phosphor powder.

In one preferred embodiment of the method of producing a wavelength conversion member according to the present invention, the method has a step of preliminarily adjusting the oxygen content in at least one of the substance serving as a silicon source, the substance serving as an aluminum source, the substance serving as a calcium source, and the substance serving as a europium source used in the step A), which constitute the mixture, wherein the composition of the mixture is such that the (oxy)nitride phosphor powder obtained by firing the mixture in an inert atmosphere has a composition represented by composition formula (1) except for that the oxygen content thereof is in excess of the theoretical oxygen amount of the (oxy)nitride phosphor represented by composition formula (1) by from 1.1 to 11.5 mass %, based on the theoretical mass of the oxynitride phosphor.

In another preferred embodiment of the method for producing a wavelength conversion member according to the present invention, the method has an oxidation step of, after the firing step, heat-treating the oxynitride phosphor powder obtained in the firing step at 800 to 1,200° C. in an oxygen-containing atmosphere, wherein the oxidation step makes it possible to obtain the oxynitride phosphor powder in which the oxygen content in excess of the theoretical oxygen amount of the oxynitride phosphor represented by composition formula (1) is from 1.1 to 11.5 mass % based on the theoretical mass of the oxynitride phosphor.

In particular, in composition formula (1), x1, x2, y and z are preferably
0<x1≤3.40,
0.05≤x2≤0.20,
4.0≤y≤6.5, and
0≤z≤1.

In the present invention, the oxygen content of the oxynitride phosphor powder in excess of the theoretical oxygen amount of composition formula (1) is preferably 4 mass % or less.

In the present invention, the oxygen content of the oxynitride phosphor powder is preferably more than 1.4 mass % and less than 5.0 mass %

In the present invention, the substance serving as a silicon source is preferably an amorphous silicon nitride.

In the present invention, the substance serving as a silicon source is preferably a crystalline silicon nitride having a specific surface area of 9 $m^2$/g or more.

The present invention also relates to an oxynitride phosphor powder having a composition, exclusive of oxygen, represented by composition formula (1):

$$Ca_{x1}Eu_{x2}Si_{12-(y+z)}Al_{(y+z)}O_zN_{16-z} \quad (1)$$

wherein x1, x2, y and z are
0<x1≤3.40,
0.05≤x2≤0.20,
3.5<y≤7.0, and
0≤z≤1, and
wherein the oxygen content is in excess of the theoretical oxygen content of the oxynitride phosphor represented by composition formula (1) and the excess oxygen amount is from 1.1 to 11.5 mass % with respect to 100 mass % of the theoretical mass of the oxynitride phosphor represented by composition formula (1).

The present invention also relates to a wavelength conversion member composed of polycrystalline ceramics obtained by sintering the oxynitride phosphor powder above.

In particular, in composition formula (1), x1, x2, y and z are preferably
0<x1≤3.40,
0.05≤x2≤0.20,
4.0≤y≤6.5, and
0≤z≤1.

In the present invention, the polycrystalline ceramics preferably contains α-SiAlON and aluminum nitride.

In the present invention, the polycrystalline ceramics preferably has relative density of 95% or more.

The present invention also relates to a light-emitting device comprising a semiconductor light-emitting element capable of emitting light at a wavelength of 300 to 500 nm and the wavelength conversion member composed of the polycrystalline ceramics above.

Effect of the Invention

According to the present invention, a wavelength conversion member can be provided, wherein the wavelength conversion member is polycrystalline ceramics having a composition represented by composition formula (1):

$$Ca_{x1}Eu_{x2}Si_{12-(y+z)}Al_{(y+z)}O_zN_{16-z} \quad (1)$$

(wherein x1, x2, y and z are 0<x1≤3.40, 0.05≤x2≤0.20, 3.5<y≤7.0 and 0≤z≤1), wherein the oxygen content is in excess of the theoretical oxygen content of the oxynitride represented by composition formula (1) and the excess oxygen amount is from 1.1 to 11.5 mass % with respect to 100 mass % of the theoretical mass of the oxynitride phosphor represented by composition formula (1), and wherein the wavelength conversion member is capable of emitting fluorescence having a peak wavelength in a broad wavelength region of 590 to 610 nm upon excitation by light at a wavelength of 300 to 500 nm, and the conversion efficiency thereof is high.

BRIEF DESCRIPTION OF THE DRAWINGS

FIG. 1 is a view illustrating the transmission/emission spectrum of Example 2.

DESCRIPTION OF EMBODIMENTS

The present invention is described in detail below.

The present invention comprises:

a method of producing a wavelength conversion member composed of polycrystalline ceramics, comprising:

A) mixing a substance serving as a silicon source, a substance serving as an aluminum source, a substance serving as a calcium source, and a substance serving as a europium source, B) firing the obtained mixture to obtain an (oxy)nitride phosphor powder, and C) sintering the oxynitride phosphor powder to obtain polycrystalline ceramics, said polycrystalline ceramics comprising an α-sialon crystal phase and an aluminum nitride crystal phase, wherein the oxynitride phosphor powder sintered has a composition in the step C) comprises Ca, Eu, Si, Al, N and O with a ratio of said Ca, Eu, Si, Al and N being a ratio of Ca, Eu, Si, Al and N in an (oxy)nitride phosphor represented by composition formula (1):

$$Ca_{x1}Eu_{x2}Si_{12-(y+z)}Al_{(y+z)}O_zN_{16-z} \quad (1)$$

wherein x1, x2, y and z are

0<x1≤3.40,
0.05≤x2≤0.20,
3.5<y≤7.0, and
0≤z≤1, the oxygen content of the (oxy)nitride phosphor powder being in excess of the theoretical oxygen content of the (oxy)nitride phosphor represented by composition formula (1), the excess oxygen amount being from 1.1 to 11.5 mass % with respect to 100 mass % of the theoretical mass of the (oxy)nitride phosphor represented by composition formula (1).

The present invention also comprises a light conversion member composed of polycrystalline ceramics obtained by the production method above. The light conversion member is capable of converting light at 300 to 500 nm to light having a peak wavelength of 590 to 610 nm.

The production method of a wavelength conversion member of the present invention resides in the above described production method. In the method for obtaining the oxynitride phosphor powder wherein the oxygen content in excess of the theoretical oxygen amount of composition formula (1) is from 1.1 to 11.5 mass %, for example, either one or both of the following steps D) and E) may be used:

D) a step of preliminarily adjusting the oxygen content in at least one of the substance serving as a silicon source, the substance serving as an aluminum source, the substance serving as a calcium source, and the substance serving as a europium source used in the step A), which constitute the mixture, wherein the composition of the mixture is such that the oxynitride phosphor powder obtained by firing the mixture in an inert atmosphere has a composition represented by composition formula (1) except for that the oxygen content thereof is in excess of the theoretical oxygen amount of the (oxy)nitride phosphor represented by composition formula (1); and E) an oxidation step of, after the firing step B), heat-treating the (oxy)nitride phosphor powder obtained in the firing step B) at 800 to 1,200° C. in an oxygen-containing atmosphere to increase the oxygen amount in the oxynitride phosphor powder.

In one preferred embodiment of the present invention, the method has a step of preliminarily adjusting the oxygen content in at least one of the substance serving as a silicon source, the substance serving as an aluminum source, the substance serving as a calcium source, and the substance serving as a europium source used in the step A), which constitute the mixture, whereby the composition of the mixture can be such that the oxynitride phosphor powder obtained by firing the mixture in an inert atmosphere has a composition, exclusive of oxygen, represented by composition formula (1) except for that the oxygen content thereof is in excess of the theoretical oxygen amount of the (oxy)nitride phosphor represented by composition formula (1) by from 1.1 to 11.5 mass %, based on the theoretical mass of the (oxy)nitride phosphor.

In another preferred embodiment of the wavelength conversion member of the present invention, the method has an oxidation step of, after the firing step, heat-treating the oxynitride phosphor powder obtained in the firing step at 800 to 1,200° C. in an oxygen-containing atmosphere, wherein the oxidation step makes it possible to obtain the oxynitride phosphor powder in which the oxygen content in excess of the theoretical oxygen amount of the oxynitride phosphor represented by composition formula (1) is from 1.1 to 11.5 mass % based on the theoretical mass of the oxynitride phosphor.

The wavelength conversion member of the present invention contains an α-SiAlON phosphor, particularly, a Ca-containing α-SiAlON phosphor. The α-SiAlON phosphor, particularly, the Ca-containing α-SiAlON phosphor, is a solid solution wherein the Si—N bond of an α-type silicon nitride is partially substituted with an Al—N bond and an Al—O bond, and Ca ion penetrates into the lattice to keep the electrical neutrality.

The α-SiAlON phosphor contained in the wavelength conversion member of the present invention is a phosphor represented by the formula above, which emits yellow-to-orange fluorescence upon excitation by light of 300 to 500 nm, wherein Eu ion is solid-dissolved into the lattice, in addition to Ca ion, to activate the Ca-containing α-SiAlON.

An α-SiAlON phosphor in which a general rare earth element is activated, is represented by composition formula (2):

$$MeSi_{12-(m+n)}Al_{(m+n)}O_nN_{16-n} \quad (2)$$

(wherein Me is one, or two or more of Ca, Mg, Y, and a lanthanide metal except for La and Ce, and is generally expressed without a coefficient because the coefficient of Me varies depending on the m value, but the coefficient is not limited to 1). The metal Me is solid-dissolved in the range from, at the minimum, one per three large unit cells of α-SiAlON containing four formula weights of $(Si,Al)_3(N,O)_4$ to, at the maximum, one per one unit cell thereof. The solid solubility limit is generally, when the metal element Me is divalent, 0.6<m<3.0 and 0≤n<1.5 in the formula above and, when the metal Me is trivalent, 0.9<m<4.5 and 0≤n<1.5. In a range except for these ranges, single-phase α-SiAlON is not obtained. Accordingly, studies of the α-SiAlON phosphor have been limited to the composition ranges above. Furthermore, in the α-SiAlON phosphor, it is known that as the m value in composition formula (2) is larger and as the n value is smaller, the emission wavelength is shifted to a longer wavelength and the emission color becomes orange.

On the other hand, when composition formula (1) is applied to composition formula (2), the polycrystalline ceramics that is the wavelength conversion member of the present invention is represented by $$Ca_{x1}Eu_{x2}Si_{12-(m+n)}Al_{(m+n)}O_zN_{16-n} \quad (1')$$

(wherein x1, x2, y and z are
0<x1≤3.40,
0.05≤x2≤0.20,
3.5<m≤7.0, and
0≤n≤1), and from comparison with the above-described composition ranges of α-SiAlON, most of composition formula (1') is a range of not a single-phase α-SiAlON (a range where an AlN phase, etc. is formed, in addition to an α-SiAlON phase) and a range with a relatively small oxygen content.

An attempt to use α-SiAlON as a ceramics member, such as bearing member, is also being made, and it is known that, above all, when the n value becomes smaller, namely, when the oxygen concentration is decreased, an α-SiAlON can be hardly sintered and a sintered body having no void in the interior can be hardly obtained. Therefore, in the case where the n value is small, an approach to obtain a dense sintered body by mixing a sintering aid, etc. is generally taken.

The present inventors have studied also on a range outside the composition range where single-phase α-SiAlON is obtained in general. As a result, they have found that in comparison with a phosphor in the above-described composition range where single-phase α-SiAlON is obtained, the luminous efficiency is remarkably enhanced, as in the present invention, in a composition range where single-phase α-SiAlON is not heretofore obtained (most of the composition range of the present invention is a range that is not single-phase α-SiAlON). In addition, they have found a production method wherein a dense sintered body is obtained even in a low-oxygen composition range like the composition of the present invention (the composition range of the present invention where the oxygen content is relatively small) and a high-efficiency wavelength conversion member is obtained.

The wavelength conversion member of the present invention and the production method thereof, and a light-emitting device fabricated by combining the wavelength conversion member and a semiconductor light-emitting element, are specifically described below.

The oxynitride phosphor powder used for the production of the wavelength conversion member of the present invention is an oxynitride phosphor powder comprising Ca, Eu, Si, Al, N and O with a ratio of said Ca, Eu, Si, Al and N being a ratio of Ca, Eu, Si, Al and N in an (oxy)nitride phosphor represented by composition formula (1):

$$Ca_{x1}Eu_{x2}Si_{12-(y+z)}Al_{(y+z)}O_zN_{16-z} \quad (1)$$

wherein 0<x1≤3.40, 0.05≤x2≤0.20, 3.5<y≤7.0 and 0≤z≤1.0, and satisfying the condition that the oxygen content is in excess of the theoretical oxygen content of the (oxy)nitride phosphor represented by composition formula (1) and the excess oxygen amount is from 1.1 to 11.5 mass % with respect to 100 mass % of the theoretical mass of the (oxy)nitride phosphor represented by composition formula (1).

The wavelength conversion member of the present invention is composed of polycrystalline ceramics obtained by sintering the oxynitride phosphor powder above.

The "polycrystalline ceramics" as used in the present invention means a polycrystalline material having a controlled small amount of pores or having no pore. The "polycrystalline material" means that a plurality of single crystal regions are connected directly or through an amorphous region wherein the single crystal regions are different in the crystal orientation from each other.

The x1 and x2 are values indicating the amounts of Ca ion and Eu ion interstitially solid-dissolved into SiAlON, and if x2 is less than 0.05 or more than 0.20, or x1 exceeds 3.40, the conversion efficiency will decrease. More preferably, 0<x1≤3.1 and 1.8≤x2≤2.2.

The y is a value determined so as to keep electrical neutrality when a metal element is solid-dissolved into SiAlON and is represented by y=2(x1)+3(x2) in the oxynitride phosphor powder above. In the formula, the coefficient of x1, i.e., 2 is a numerical value based on the valence of Ca ion solid-dissolved into the Ca-containing α-SiAlON phosphor and the coefficient of x2, i.e., 3 is a numerical value based on the valence of Eu ion solid-dissolved into the Ca-containing α-SiAlON phosphor. In addition, the wavelength conversion member of the present invention contains α-SiAlON and aluminum nitride, and therefore the y is a value related to the amount of aluminum nitride produced. That is, when the y value exceeds the composition range where single-phase α-SiAlON is obtained (in the formula above, for example, in case of 3.0≤m when the metal element Me is divalent or in case of 4.5≤m when the metal Me is trivalent), aluminum nitride and other aluminum-containing oxynitrides are produced.

In the present invention, the ranges of the y and z are 3.5<y≤7.0 and 0≤z≤1. In the case of a composition where the y and z are in these ranges, a wavelength conversion member having a high conversion efficiency is provided.

When the y exceeds 7.0, the amount of an aluminum nitride crystal phase produced becomes too large and the conversion efficiency decreases. When the y is less than 3.5, the conversion efficiency decreases and the emission peak wavelength becomes smaller than 590 nm. Furthermore, z is a value related to the amount of oxygen substitutionally solid-dissolved into α-SiAlON. When the z exceeds 1, the emission peak wavelength becomes smaller than 590 nm. In addition, when 1≤y<2.3 and 0≤z<1.5 or when 2.3≤y≤3.5 and 0≤z<1, the conversion efficiency decreases. When 0≤y<1.0 and 0≤z<1.5, β-SiAlON is produced and the conversion efficiency decreases.

In the present invention, the ranges of the y and z are preferably 4.0≤y≤6.5 and 0≤z≤1, more preferably 4.0≤y≤5.5 and 0≤z≤1.0. In the case of a composition where y and z are in these ranges, a wavelength conversion member having a higher conversion efficiency is provided.

When crystal phases are identified by an X-ray diffractometer (XRD) using CuKα radiation, the polycrystalline ceramics of the present invention is composed of an α-SiAlON crystal phase alone classified into a trigonal system or composed of α-SiAlON crystal phase and an aluminum nitride crystal phase classified into a hexagonal system, and sometimes contains an aluminum oxynitride crystal phase (e.g., $Al_{2.81}O_{3.56}N_{0.44}$), in addition to those crystal phases. If the contents of an aluminum nitride crystal phase and an aluminum oxynitride crystal phase are too much increased, the conversion efficiency will decrease. The content of the aluminum nitride crystal phase contained in the polycrystalline ceramics is preferably more than 0 mass % and less than 15 mass %, more preferably more than 0 mass % and less than 10 mass %. In the case of containing the aluminum nitride crystal phase in this range, higher conversion efficiency is obtained.

Identification of the crystal phase by XRD measurement can be performed using an X-ray pattern analysis software.

The analysis software includes, for example, PDXL produced by Rigaku Corporation. XRD measurement of polycrystalline ceramics, refinement of lattice constant, and quantification of crystal phase by the Rietveld method were performed by using X-ray diffractometer (Ultima IV Protectus) and analysis software (PDXL) produced by Rigaku Corporation.

The wavelength conversion member of the present invention can be used as a light-emitting device for various display devices by combining the member with a known light-emitting source, such as light-emitting diode.

In particular, a light-emitting source capable of emitting excitation light having a peak wavelength of 300 to 500 nm is suitable for the wavelength conversion member of the present invention. The wavelength conversion member exhibits a high luminous efficiency in the ultraviolet region and can constitute a light-emitting element having good performance. The luminous efficiency is also high with a blue light source, and the wavelength conversion member of the present invention can be used, by virtue of its orange fluorescence, for various display devices, such as vehicular marker lamp.

The transmission/emission characteristics of the wavelength conversion member (polycrystalline ceramics) of the present invention can be evaluated by means of an optical measurement system using an integrating sphere. Specifically, the wavelength conversion member was joined onto a semiconductor light-emitting element having an emission color with a peak wavelength of 455 nm by using a silicone resin and measured by the total luminous flux measurement system manufactured by Spectra Co-op. The normalized luminous flux calculated according to the following formula was defined as the conversion efficiency.

$$\text{Conversion efficiency (normalized luminous flux)} = \frac{\text{Total luminous flux (lm) when wavelength conversion member is mounted}}{\text{Total radiant flux (mW) when wavelength conversion member is not mounted}} \quad [\text{Math. 1}]$$

Next, the production method of the wavelength conversion member of the present invention is specifically described. A substance serving as a silicon source, a substance serving as a europium source, a substance serving as a calcium source, and a substance serving as an aluminum source are mixed, and an oxynitride phosphor powder obtained by firing the mixture at a temperature of 1,500 to 2,000° C. in an inert gas atmosphere is molded and fired at a temperature of 1,500 to 2,000° C. in an inert gas atmosphere, whereby the wavelength conversion member of the present invention can be obtained.

Conventionally, in the case of producing α-SiAlON, raw material powders, i.e., a substance serving as a silicon source, a substance serving as a europium source, a substance serving as a calcium source, and a substance serving as an aluminum source, are mixed so as to obtain a composition represented by composition formula (2), and the mixture is fired at a temperature of 1,500 to 2,000° C. in an inert gas atmosphere to obtain α-SiAlON. As the raw material powder, an oxide or a substance capable of producing an oxide by a heat treatment is also used, in addition to a nitride, but the content of the oxide in the raw material powders is adjusted to essentially conform to the theoretical oxygen amount in the composition of α-SiAlON to be produced. Although a oxide thin film is sometimes present on the surface of the raw material powders, the content of oxygen as the impurity is only 1.0 mass % or less with respect to 100 mass % of the α-SiAlON, and therefore the effects taught in the present invention are not exerted. Even when oxygen is contained in the atmosphere of firing the raw material powder mixture, the composition (oxygen content) of the α-SiAlON produced from the raw material powders is substantially unchanged.

On the other hand, in the present invention, the composition of the raw material powder mixture obtained by mixing a substance serving as a silicon source, a substance serving as a europium source, a substance serving as a calcium source, and a substance serving as an aluminum source is selected such that an obtained oxynitride phosphor powder, through or not through an oxidation step after firing, has a composition, exclusive of oxygen, represented by composition formula (1):

$$Ca_{x1}Eu_{x2}Si_{12-(y+z)}Al_{(y+z)}O_zN_{16-z} \quad (1)$$

(wherein $0 < x1 \leq 3.40$, $0.05 \leq x2 \leq 0.20$, $3.5 < y \leq 7.0$ and $0 \leq z \leq 1$) and contains oxygen in excess of the theoretical oxygen content of the oxynitride phosphor represented by composition formula (1) and the oxygen amount in excess of the theoretical oxygen amount of composition formula (1) is from 1.1 to 11.5 mass %.

In the present invention, when the raw materials are mixed to satisfy composition formula (1), the mixing ratio of the raw material powders, i.e., the substance serving as a silicon source, the substance serving as a europium source, the substance serving as a calcium source, and the substance serving as an aluminum source, is determined, based on the amounts of silicon, europium, calcium and aluminum, respectively, and the masses of compounds theoretically calculated as a nitride, an oxide or other compounds of those elements. Impurities (for example, oxygen present in nitride) are not taken into account in the calculation. For example, in the case of using silicon nitride as a raw material, the mixing ratio of silicon nitride is determined by assuming it as a material not containing oxygen. With regard to the raw material used for the production of an oxynitride phosphor powder, a material in which the content of metal impurity is of negligible level (for example, 100 ppm or less) is used. For example, calculation may be performed by assuming the silicon nitride raw material as pure silicon nitride, but if needed, performed by taking into account the silicon nitride content of the raw material.

In the present invention, the thus-calculated oxygen content as a theoretical content in the oxynitride phosphor powder represented by composition formula (1) produced from the raw materials and the oxygen content as a measured value are compared, and the difference therebetween is defined as the excess oxygen content.

The substance serving as a silicon source of the raw material is selected from nitride, oxynitride and oxide of silicon and a precursor substance capable of becoming an oxide of silicon by pyrolysis. A silicon nitride, more specifically, a crystalline silicon nitride or an amorphous silicon nitride, is preferably used, as the substance serving as a silicon source. A crystalline silicon nitride or an amorphous silicon nitride is preferably used since a sintered body of the polycrystalline ceramics is likely to have a larger density and an increased conversion efficiency. In particular, in the case of using a crystalline silicon nitride, a crystalline silicon nitride having a specific surface area of 9 to 30 m²/g is more preferred. In the case of using an amorphous silicon nitride, the specific surface area thereof is more preferably from 600 to 800 m²/g. When the specific surface area of a crystalline silicon nitride is from 9 to 30 m²/g or the specific surface area of an amorphous silicon nitride is from 600 to 800 m²/g, the density of a sintered body becomes larger and the conversion efficiency more increases.

The specific surface area of a crystalline silicon nitride or an amorphous silicon nitride was measured by using a specific surface area measuring apparatus, FlowSorb Model 2300, manufactured by Shimadzu Corporation (BET method by nitrogen gas adsorption).

The substance serving as a europium source of the raw material is selected from nitride, oxynitride and oxide of europium and a precursor substance capable of becoming an oxide of europium by pyrolysis. In the case of preparing the raw material to satisfy z=0 in composition formula (1), europium nitride is preferably used. In the case of preparing the raw material to satisfy z>0, it is preferable to use europium oxide alone or use europium oxide and europium nitride in combination.

The substance serving as a calcium source of the raw material is selected from nitride, oxynitride and oxide of calcium and a precursor substance capable of becoming an oxide of calcium by pyrolysis. In the case of preparing the raw material to satisfy z=0 in composition formula (1), calcium nitride is preferably used. In the case of preparing the raw material to satisfy z>0, it is preferable to use calcium carbonate alone or use calcium carbonate and calcium nitride in combination.

The substance serving as an aluminum source of the raw material includes aluminum oxide, metal aluminum and aluminum nitride, and the powders thereof may be used individually or in combination.

In the firing of oxynitride phosphor, an Li-containing compound serving as a sintering aid is preferably added for the purpose of accelerating the sintering and producing an α-SiAlON crystal phase at a lower temperature. The Li-containing compound used includes lithium oxide, lithium carbonate, metal lithium, and lithium nitride, and the powders thereof may be used individually or in combination. The amount of the Li-containing compound added is, in terms of Li element, preferably from 0.01 to 0.5 mol, more preferably from 0.01 to 0.1 mol, per mol of the fired oxynitride.

The method for mixing the substance serving as a silicon source, the substance serving as a europium source, the substance serving as a calcium source, the substance serving as an aluminum source, and an optional sintering aid, is not particularly limited. A method known per se, for example, a method of dry mixing the substances, and a method of wet mixing the substances in an inert solvent substantially incapable of reacting with each raw material component and then removing the solvent, may be employed. As the mixing apparatus, a V-shaped mixer, a rocking mixer, a ball mill, a vibration mill, a medium stirring mill, etc. are suitably used.

A mixture of the substance serving as a silicon source, the substance serving as a europium source, the substance serving as a calcium source, the substance serving as an aluminum source, and an optional sintering aid, is fired at a temperature of 1,500 to 2,000° C. in an inert gas atmosphere, whereby a fired oxynitride can be obtained. The inert gas atmosphere means an inert gas atmosphere, such as nitrogen, and the oxygen concentration in the atmosphere is preferably 100 ppm or less, more preferably 10 ppm or less. The inert atmosphere where the inert gas is nitrogen may be a reducing atmosphere containing a hydrogen gas. The firing temperature less than 1,500° C. is not practical since the production of α-SiAlON requires heating for a long time. The firing temperature exceeding 2,000° C. is undesirable since silicon nitride and α-SiAlON are sublimated and decomposed to produce free silicon. A temperature range from 1,600 to 2,000° C. is preferred. The heating furnace used for firing is not particularly limited as long as firing at 1,500 to 2,000° C. in an inert gas atmosphere can be performed. For example, a batch electric furnace of high frequency induction heating system or resistance heating system, a rotary kiln, a fluidized firing furnace, and a pusher-type electric furnace can be used. As for the crucible filled with the mixture, a BN-made crucible, a silicon nitride-made crucible, a graphite-made crucible, and a silicon carbide-made crucible can be used.

An oxynitride phosphor powder having a sharp particle size distribution can be obtained by subjecting the fired oxynitride to disintegration and classification. The disintegration as used herein means an operation of disintegrating an aggregate (secondary particle) of primary particles constituting the fired oxynitride into primary particles and is differentiated from pulverization. The method for disintegrating is not particularly limited, but a disintegrating method, such as roll crusher, ball mill, bead mill and stamp mill, can be used. The method for classification is not particularly limited, but a classification device, such as sieve classifier, cyclone classifier and dry air flow classifier, can be used. By performing classification after disintegration, an oxynitride phosphor powder having a particle diameter ($D_{50}$) of 50 μm or less, preferably 20 μm or less, can be obtained. When the particle diameter is 50 μm or less, a sintered body is likely to have a larger density, and the conversion efficiency more increases. Furthermore, the particle diameter 20 μm or less is preferable since not only a sintered body is likely to have a larger density and the conversion efficiency more increases but also at the time of sintering of the polycrystalline ceramics, a lower sintering temperature or a shorter firing time can be employed. In the production method of the present invention, it is only necessary to disintegrate the fired oxynitride, but pulverizing the fired oxynitride to obtain particles having a desired particle diameter is not precluded.

$D_{50}$ of the oxynitride phosphor powder is a 50% diameter (weight-based median value) in the particle size distribution curve measured by a laser diffraction/scattering particle size distribution measuring apparatus.

In the present invention, the oxygen amount larger than the theoretical oxygen amount of composition formula (1) of the oxynitride phosphor powder is from 1.1 to 11.5 mass %. In the present invention, the oxygen amount in excess of the theoretical oxygen amount is calculated assuming the theoretical mass of the oxynitride phosphor represented by formula (1) to be 100 mass %. When the oxygen amount larger than the theoretical oxygen amount of composition formula (1) of the oxynitride phosphor powder is less than 1.1 mass %, the relative density of a sintered body becomes small. When the relative density of a sintered body becomes small, light excited by light at 300 to 500 nm and wavelength-converted, that is, light at 590 to 610 nm, is scattered due to voids present in the polycrystalline ceramics, leading to very poor light extraction. Therefore, the conversion efficiency significantly decreases. When the oxygen amount above exceeds 11.5 mass %, the oxygen content becomes large, and the contents of oxygen and nitrogen greatly deviate from composition formula (1) to significantly disrupt the charge compensation in the phosphor crystal, as a result, the conversion efficiency decreases. The oxygen amount in excess of the theoretical oxygen amount is preferably from 1.1 to 7.8 mass %, more preferably from 1.1 to 3.5 mass %.

The oxygen amount in excess of the theoretical oxygen amount may also be 1.2 mass % or more, 1.4 mass % or more, or 1.5 mass % or more.

In the production method of the present invention, a substance serving as a silicon source, a substance serving as an aluminum source, a substance serving as a calcium source, a substance serving as a europium source, and an optional sintering aid, are mixed, and the mixture is fired or is fired and then subjected to oxidation treatment, whereby the oxygen content in excess of the theoretical oxygen amount of composition formula (1) can be from 1.1 to 11.5 mass % in the oxynitride phosphor powder. The oxygen in excess of the theoretical oxygen amount is supplied from oxygen in the raw material or oxygen in the atmosphere. For example, even when a commercially available silicon nitride powder is assumed as an oxygen-free raw material and weighed and mixed to satisfy z=0, the obtained oxynitride phosphor powder contains oxygen in an amount of approximately from 0.5 to 1.0 mass % since the commercially available silicon nitride powder actually contains a certain amount of oxygen. This is attributable to trace impurity oxygen contained in the raw material or to an amorphous phase containing oxygen present on the surface of the oxynitride phosphor powder. The oxygen amount of the present invention is an oxygen concentration including the impurity oxygen derived from the raw material and the oxygen contained in the amorphous phase.

The specific method for adjusting the oxygen amount in excess of the theoretical oxygen amount of composition formula (1) to the range from 1.1 to 11.5 mass % in the oxynitride phosphor powder includes a method of adjusting the concentration of impurity oxygen contained in the raw material. For example, an oxygen amount in the range above can be achieved by adjusting the oxygen concentration of a crystalline silicon nitride or amorphous silicon nitride serving as a main raw material. The crystalline silicon nitride or amorphous silicon nitride usually contains 1.0 mass % or less of impurity oxygen. The impurity oxygen includes oxygen present in a silicon nitride particle, and oxygen present on the particle surface. The method for reducing the impurity oxygen concentration can be performed by subjecting the silicon nitride powder to a cleaning treatment with use of an acid, such as nitric acid and hydrofluoric acid. The method for increasing the impurity oxygen concentration can be performed by heat-treating the silicon nitride powder in the air or in an oxygen-containing atmosphere. The concentration of oxygen contained in a crystalline silicon nitride or amorphous silicon nitride as a raw material powder is preferably 5.0 mass % or less. The oxygen concentration of 5.0 mass % or more is not preferred since the compositional deviation from composition formula (1) is too large.

As the specific surface area of a crystalline silicon nitride or amorphous silicon nitride serving as a raw material is larger, the concentration of impurity oxygen contained is likely to be increased. Furthermore, when the specific surface area of a crystalline silicon nitride or amorphous silicon nitride serving as a raw material is large, oxygen more than the concentration of oxygen contained in the crystalline silicon nitride or amorphous silicon nitride as a raw material is contained in the oxynitride phosphor powder. This is because due to the large specific surface area of the crystalline silicon nitride or amorphous silicon nitride as a raw material, oxygen adsorbed to the surface thereof is readily mixed into the oxynitride phosphor powder in the production process of the powder. Accordingly, in the case of adjusting the oxygen concentration of the oxynitride phosphor powder, the specific surface area of a crystalline silicon nitride or amorphous silicon nitride serving as a raw material must be appropriately controlled. In the present invention, a crystalline silicon nitride having a specific surface area of 9 to 30 m$^2$/g is preferably used, and an amorphous silicon nitride having a specific surface area of 600 to 800 m$^2$/g is more preferably used.

As another method for adjusting the oxygen amount of the oxynitride phosphor powder, an oxidation step of heat-treating the oxynitride phosphor powder in the air or in an oxygen-containing atmosphere may be provided. The oxygen concentration in the oxygen-containing atmosphere is preferably from 0.1 to 21.0 vol %. In that case, the thickness of an amorphous phase present on the surface of the oxynitride phosphor powder is increased, and the oxygen amount of the oxynitride phosphor powder increases. With regard to the conditions of heat treatment, a temperature range from 800 to 1,200° C. is preferred although not limited to this range. A temperature of less than 800° C. is undesirable since there is no or very slight increase in the oxygen concentration. On the other hand, a temperature of 1,200° C. or more is not preferred, since oxidation of the oxynitride phosphor powder rapidly proceeds and the oxygen concentration becomes difficult to control. A temperature range from 800 to 950° C. is more preferred. In the case of performing a heat treatment, the time for which the powder is held at the maximum temperature is preferably from 0.5 to 10 hours so as to obtain, among others, high conversion efficiency.

The method for adjusting the oxygen content of the oxynitride phosphor powder according to the present invention includes, as described above, a method of adjusting the oxygen amount of the raw material powder, and a method of providing a heat-treatment step to oxidize the oxynitride phosphor powder, and these methods may be employed in combination. Accordingly, in the case where a sufficient oxygen amount is ensured in the raw material, it is not necessary to provide a heat treatment step. In the case where the oxygen amount in the raw material is small, an oxynitride phosphor powder containing the required excess oxygen can be obtained by adjusting the conditions of the heat-treatment step.

The oxygen amount larger than the theoretical oxygen amount of composition formula (1) of the oxynitride phosphor powder is preferably from 1.1 to 4.0 mass %. As described above, when the oxygen amount larger than the theoretical oxygen amount is less than 1.1 mass %, the density of a sintered body becomes small. When the oxygen content exceeds 4 mass %, the contents of oxygen and nitrogen greatly deviate from composition formula (1) to disrupt the charge compensation in the phosphor crystal, as a result, the effect of improving the conversion efficiency is reduced.

The thickness of an oxygen-containing amorphous phase present on the phosphor powder surface of the oxynitride phosphor powder is preferably from more than 1 nm to less than 10 nm. When the thickness of the oxygen-containing amorphous phase is 1 nm or less, the density of a sintered body of the polycrystalline ceramics may become small to decrease the conversion efficiency. When the thickness of the oxygen-containing amorphous phase (there is a composition (O, N) gradient in the thickness direction wherein the outermost surface is substantially an oxide phase, and the oxygen concentration is reduced toward the inner side) is 10 nm or more, the conversion efficiency may decrease.

The thickness of the above-described amorphous phase present on the surface of the oxynitride phosphor powder can be adjusted, as described above, by a method of heat-treating the oxynitride phosphor powder in the air or in an oxygen-containing atmosphere or a method of adjusting the oxygen content of the raw material serving as a silicon source. Specifically, the thickness of the oxygen-containing amorphous phase of the obtained oxynitride phosphor powder can be increased by using an amorphous silicon nitride. In the case of using a crystalline silicon nitride, the thickness of the oxygen-containing amorphous phase of the obtained oxynitride phosphor powder can be increased by using a crystalline silicon nitride having a large oxygen content or using a crystalline silicon nitride having a large specific surface area.

The oxygen amount of the oxynitride phosphor powder is preferably from 1.4 to 5.0 mass %. An oxygen content of 1.4 to 5.0 mass % is preferred, since the density of a sintered body of the polycrystalline ceramics is likely to become large and the conversion efficiency increases. When the oxygen amount is less than 1.4 mass %, the density of a sintered body of the polycrystalline ceramics may be little increased, and due to voids present in the polycrystalline ceramics, the improvement of extraction efficiency of the wavelength-converted light may decrease, leading to a small improvement of the conversion efficiency. When the oxygen amount exceeds 5 mass %, the emission peak wavelength is likely to become 590 nm or less, and the improvement of conversion efficiency may be reduced. The oxygen amount of the oxynitride phosphor can be adjusted by controlling z in composition formula (1). Specifically, the oxygen amount can be adjusted by using an oxygen-containing raw material to obtain a predetermined oxygen concentration. When the oxygen amount of the oxynitride phosphor powder is adjusted to 5 mass % or more by controlling z in composition formula (1), the emission peak wavelength is likely to become 590 nm or less and the improvement of the conversion efficiency may be reduced. In addition, as described above, there is a method of increasing oxygen to exceed the theoretical oxygen amount of composition formula (1), specifically, a method of adjusting the concentration of impurity oxygen contained in the raw material, or a method of providing an oxidation step of heat-treating the powder in the air or in an oxygen-containing atmosphere.

The oxygen contents of the oxynitride phosphor powder, crystalline silicon nitride and amorphous silicon nitride can be measured by an oxygen/nitrogen analyzer or an oxygen-nitrogen simultaneous analyzer manufactured by LECO. The thickness of the surface amorphous phase of the oxynitride phosphor powder can be measured by a scanning transmission electron microscope, Cs-corrected STEM Model JEM-2100F (hereinafter, referred to as STEM), manufactured by JEOL Ltd.

As the method for molding and firing the polycrystalline ceramics, although not limited to these methods, a normal pressure sintering method, a pressure sintering method, a hot plasma sintering method, a discharge plasma sintering method, etc. can be utilized. In order to obtain polycrystalline ceramics having a large sintering density without using a sintering aid, a pressure sintering method, a hot plasma sintering method or a discharge plasma sintering method is preferably employed. In the pressure sintering method, the oxynitride phosphor powder filled in a graphite-made die can be fired at a temperature of 1,500 to 2,000° C. in an inert gas atmosphere while applying a uniaxial pressure. In order to suppress sublimation and decomposition of the oxynitride phosphor powder, a gas pressure of 0.2 to 1 MPa is preferably applied.

Sintering (firing) of the polycrystalline ceramics is preferably performed under the conditions affording a large sintering density and at a lower temperature. Firing at a high temperature is not preferred, since calcium, europium and silicon contained in the oxynitride phosphor are sublimated to change the composition of the obtained polycrystalline ceramics. For this reason, the firing temperature is preferably from 1,500 to 2,000° C., more preferably from 1,500 to 1,850° C.

In order to obtain polycrystalline ceramics having a large density at a lower firing temperature, the primary particle constituting the oxynitride phosphor powder is preferably small. The primary particle as used herein indicates a minimum unit of a crystal grain constituting the powder, that is, a region where the crystal orientation is aligned and a grain boundary is not formed in the interior. The phosphor powder is composed of a secondary particle resulting from fusion or aggregation of primary particles. The primary particles can be made small by increasing the specific surface area of a crystalline silicon nitride or amorphous silicon nitride serving as a raw material of the oxynitride phosphor powder. In the present invention, a crystalline silicon nitride having a specific surface layer of 9 to 30 $m^2/g$ is preferably used, and an amorphous silicon nitride having a specific surface area of 600 to 800 $m^2/g$ is more preferably used.

The polycrystalline ceramics can be processed into a predetermined dimension by the existing ceramics processing technique, and the thickness of the polycrystalline ceramics can be adjusted by polishing. The thickness of the polycrystalline ceramics is preferably from 100 to 300 μm. The thickness of the polycrystalline ceramics less than 100 μm is not preferred, since cracking, chipping, etc. may be generated in the course of processing the polycrystalline ceramics. The thickness more than 300 μm is not preferred, since the conversion efficiency decreases.

The oxynitride phosphor powder and polycrystalline ceramics of the present invention may contain fluorine but need not contain fluorine. The oxynitride phosphor powder and polycrystalline ceramics preferably contain less than 20 ppm of fluorine, 10 ppm or less of fluorine, or substantially no fluorine.

EXAMPLES

The present invention is described in more detail below by referring to specific examples.

Example 1

An amorphous silicon nitride having a specific surface area of 782 $m^2/g$ and an oxygen concentration of 1.28 mass %, europium nitride, aluminum nitride and calcium nitride were weighed in a nitrogen-purged glove box to provide the designed oxynitride composition shown in Table 1, and mixed by use of a dry vibration mill to obtain a mixed powder. Assuming the oxygen content of the silicon nitride raw material to be 0 mass % (the mass of the amorphous silicon nitride was calculated as the amount of pure silicon nitride) and assuming the purity of each raw material to be 100%, the amount of the raw material was calculated.

The mixed powder obtained was put in a silicon nitride-made crucible, and the crucible was charged into a graphite resistance heating-type electric furnace. The temperature was raised to 1,725° C. in the state of keeping the atmospheric pressure while flowing nitrogen into the electric furnace, and then held at 1,725° C. for 12 hours to obtain a fired oxynitride. The fired oxynitride obtained was disintegrated and classified into a powder having a particle diameter of 20 μm or less to obtain the oxynitride phosphor powder for use in the present invention.

$D_{50}$ of the obtained oxynitride phosphor powder was 13.3 μm. $D_{50}$ of the oxynitride phosphor powder of the present invention is a 50% diameter in the particle size distribution curve measured by a laser diffraction/scattering particle size distribution measuring apparatus.

The oxygen content of the obtained oxynitride phosphor powder was 2.47 mass %, and the increase of the oxygen content relative to the oxygen content calculated from composition formula (1), i.e., 0 mass %, was 2.47 mass %. The oxygen content was measured by an oxygen-nitrogen simultaneous analyzer manufactured by LECO. Furthermore, the true density of the obtained oxynitride phosphor powder was measured by a pycnometer method and found to be 3.34 g/cm$^3$.

A hot press firing of the obtained oxynitride phosphor powder was performed by using a graphite-made die. The firing was performed under the conditions of a press load of 25 MPa and a nitrogen pressurized atmosphere of 0.8 MPa by raising the temperature to 1,850° C. and holding the temperature at 1,850° C. for 8 hours. The obtained polycrystalline ceramics was polished to a thickness of 150 μm to obtain the wavelength conversion member of the present invention.

The density of the wavelength conversion member composed of the obtained polycrystalline ceramics was measured by the Archimedes method and found to be 3.28 g/cm$^3$. Thus, the wavelength conversion member had a relative density of 98.3% to the true density of the oxynitride phosphor powder used as the raw material.

XRD measurement of the wavelength conversion member composed of the obtained polycrystalline ceramics was performed. The wavelength conversion member consisted of an α-SiAlON crystal phase and an aluminum nitride crystal phase. In Example 1, the content of aluminum nitride was 5 mass %

For evaluating the transmission/emission characteristics of the obtained wavelength conversion member, the wavelength conversion member was joined onto a semiconductor light-emitting element having an emission color with a peak wavelength of 455 nm by using a silicone resin. The measurement was performed by means of the total luminous flux measurement system manufactured by Spectra Co-op. The peak wavelength and total luminous flux were determined from the obtained emission spectrum, and the conversion efficiency was calculated. The emission characteristics of the wavelength conversion member according to Example 1 are shown in Table 2.

Examples 2 to 12

Oxynitride phosphor powders were obtained by the same method as in Example 1 except that the raw material powders according to Examples 2 to 12 were weighed and mixed so that the oxynitride phosphor powder has the designed composition of Table 1. Assuming the oxygen content of the silicon nitride raw material to be 0 mass % and assuming the purity of each raw material to be 100%, the amount of the raw material was calculated. $D_{50}$ and the oxygen content of the obtained oxynitride phosphor powders were measured. The results are shown in Table 1. Furthermore, wavelength conversion members composed of polycrystalline ceramics were produced by using the obtained oxynitride phosphor powders and subjected to identification of the constituent crystal phase and evaluation of transmission/emission characteristics, by the same method as in Example 1. The results are shown in Table 2.

In Table 1, the kind, specific surface area and oxygen concentration of the silicon raw material as a raw material, the values of x1, x2, y and z in composition formula (1), and the average particle diameter, oxygen content (measured value) and excess oxygen amount (difference between measured value and theoretical value) of the oxynitride phosphor powder are shown. In Table 2, the crystal phase, relative density, peak wavelength and conversion efficiency of the polycrystalline ceramics obtained by sintering are shown.

It is seen from Tables 1 and 2 that the wavelength conversion members produced using an oxynitride phosphor powder satisfying, as in Examples 1 to 6 and 8 to 11, the ranges of $0<x1\le3.40$, $0.05\le x2\le0.20$, $4.0\le y\le6.5$ and $0\le z\le1$ in composition formula (1) have, among others, an increased conversion efficiency.

Examples 13 to 18

Oxynitride phosphor powders were obtained by the same method as in Example 2 except that the silicon nitride powder as a raw material was changed to a crystalline silicon nitride powder having a specific surface area of 0.3 to 28.5 m$^2$/g and an oxygen concentration of 0.29 to 0.96 mass %. Assuming the oxygen content of the silicon nitride raw material to be 0 mass % and assuming the purity of each raw material to be 100%, the amount of the raw material was calculated. $D_{50}$ and the oxygen content of the obtained oxynitride phosphor powders were measured by the same methods as in Example 2. The results are shown in Table 1. Furthermore, wavelength conversion members composed of a polycrystalline ceramics were produced by using the obtained oxynitride phosphor powders and subjected to identification of the constituent crystal phase and evaluation of transmission/emission characteristics, by the same method as in Example 2. The results are shown in Table 2.

It is seen from Tables 1 and 2 that when an amorphous silicon nitride powder having a specific surface area of 600 to 800 m$^2$/g or a crystalline silicon nitride powder having a specific surface area of 9 m$^2$/g or more was used, the wavelength conversion member has, among others, an increased conversion efficiency.

Examples 19 to 25

Oxynitride phosphor powders produced by the same method as in Examples 2 and 13 to 18 were obtained. Assuming the oxygen content of the silicon nitride raw material to be 0 mass % and assuming the purity of each raw material to be 100%, the amount of the raw material was calculated. The obtained oxynitride phosphor powders were subjected to an oxidation treatment under the conditions of 900° C. and 5 hours to obtain raw material phosphor powders. $D_{50}$ and the oxygen content of the obtained raw material phosphor powders were measured by the same methods as in Example 2. The results are shown in Table 1. Furthermore, wavelength conversion members composed of a polycrystalline ceramics were produced by using the obtained raw material phosphor powders and subjected to identification of the constituent crystal phase and evaluation of transmission/emission characteristics, by the same method as in Example 2. The results are shown in Table 2. FIG. 1 shows the transmission/emission spectrum of Example 18.

It is seen from Tables 1 and 2 that when the oxynitride phosphor powder is subjected to an oxidation treatment under the conditions of 900° C. and 5 hours to obtain a raw material phosphor powder, the wavelength conversion member has, among others, increased conversion efficiency, compared with the case of not performing an oxidation treatment.

Examples 26 to 32

Oxynitride phosphor powders produced by the same method as in Examples 2 and 13 to 18 were obtained. Assuming the oxygen content of the silicon nitride raw material to be 0 mass % and assuming the purity of each raw material to be 100%, the amount of the raw material was calculated. The obtained oxynitride phosphor powders were subjected to an oxidation treatment under the conditions of 1,000° C. and 5 hours to obtain raw material phosphor powders. $D_{50}$ and the oxygen content of the obtained raw material phosphor powders were measured by the same methods as in Example 2. The results are shown in Table 1. Furthermore, wavelength conversion members composed of a polycrystalline ceramics were produced by using the obtained raw material phosphor powders and subjected to identification of the constituent crystal phase and evaluation of transmission/emission characteristics, by the same method as in Example 2. The results are shown in Table 2.

It is seen from Tables 1 and 2 that when an oxidation treatment of the oxynitride phosphor powder is performed under the conditions of 1,000° C. and 5 hours, the oxygen content and the incremental oxygen amount are 5 mass % or more. As for the conversion efficiency of the polycrystalline ceramics, it is understood that although the effect is small, the conversion efficiency is improved, compared with the case of performing an oxidation treatment of the oxynitride phosphor powder under the conditions of 900° C. and 5 hours.

Examples 33 to 39

Oxynitride phosphor powders produced by the same method as in Examples 2 and 13 to 18 were obtained. Assuming the oxygen content of the silicon nitride raw material to be 0 mass % and assuming the purity of each raw material to be 100%, the amount of the raw material was calculated. The obtained oxynitride phosphor powders were subjected to an oxidation treatment under the conditions of 1,100° C. and 5 hours to obtain raw material phosphor powders. $D_{50}$ and the oxygen content of the obtained raw material phosphor powders were measured by the same methods as in Example 2. The results are shown in Table 1. Furthermore, wavelength conversion members composed of a polycrystalline ceramics were produced by using the obtained raw material phosphor powders and subjected to identification of the constituent crystal phase and evaluation of transmission/emission characteristics, by the same method as in Example 2. The results are shown in Table 2.

As seen from Tables 1 and 2, when an oxidation treatment of the oxynitride phosphor powder is performed under the conditions of 1,100° C. and 5 hours, the oxygen content and the incremental oxygen amount are 9 mass % or more. As for the conversion efficiency of the polycrystalline ceramics, compared with the case of performing an oxidation treatment of the oxynitride phosphor powder under the conditions of 900° C. and 5 hours, the conversion efficiency is improved, though the effect is small. Among others, when the specific surface area of the crystalline silicon nitride as the raw material is 0.29 m²/g, enhancement of the conversion efficiency is recognized.

Comparative Examples 1 to 13

Oxynitride phosphor powders were obtained by the same method as in Example 1 except that the raw material powders according to Comparative Examples 1 to 13 were weighed and mixed so that the oxynitride phosphor powder has the designed composition of Table 1. Assuming the oxygen content of the silicon nitride raw material to be 0 mass % and assuming the purity of each raw material to be 100%, the amount of the raw material was calculated. $D_{50}$ and the oxygen content of the obtained oxynitride phosphor powders were measured by the same methods as in Example 1. The results are shown in Table 1. Furthermore, wavelength conversion members composed of a polycrystalline ceramics were produced by using the obtained oxynitride phosphor powders and subjected to identification of the constituent crystal phase and evaluation of transmission/emission characteristics, by the same method as in Example 1. The results are shown in Table 2.

TABLE 1

| | Silicon Raw Material | SSA [m²/g] | Oxygen Concentration of Silicon Raw Material [mass %] | x1 | x2 | y | z | Average Particle Diameter $D_{50}$ [nm] | Oxygen Content [mass %] | Incremental Oxygen Amount* [mass %] |
|---|---|---|---|---|---|---|---|---|---|---|
| Example 1 | amorphous silicon nitride | 782 | 1.28 | 2.15 | 0.100 | 4.6 | 0.0 | 13.3 | 2.47 | 2.47 |
| Example 2 | amorphous silicon nitride | 782 | 1.28 | 2.00 | 0.200 | 4.6 | 0.0 | 13.8 | 2.56 | 2.56 |
| Example 3 | amorphous silicon nitride | 782 | 1.28 | 2.15 | 0.100 | 4.6 | 0.5 | 14.1 | 2.83 | 1.61 |
| Example 4 | amorphous silicon nitride | 782 | 1.28 | 2.00 | 0.200 | 4.6 | 0.5 | 13.5 | 2.64 | 1.44 |
| Example 5 | amorphous silicon nitride | 782 | 1.28 | 2.15 | 0.100 | 4.6 | 1.0 | 14.3 | 3.55 | 1.12 |
| Example 6 | amorphous silicon nitride | 782 | 1.28 | 2.00 | 0.200 | 4.6 | 1.0 | 12.8 | 3.53 | 1.13 |
| Example 7 | amorphous silicon nitride | 782 | 1.28 | 1.85 | 0.100 | 3.6 | 0.5 | 13.9 | 3.02 | 1.78 |
| Example 8 | amorphous silicon nitride | 782 | 1.28 | 1.85 | 0.100 | 4.0 | 0.5 | 12.9 | 2.85 | 1.61 |

TABLE 1-continued

| | Silicon Raw Material | SSA [m²/g] | Oxygen Concentration of Silicon Raw Material [mass %] | x1 | x2 | y | z | Average Particle Diameter $D_{50}$ [nm] | Oxygen Content [mass %] | Incremental Oxygen Amount* [mass %] |
|---|---|---|---|---|---|---|---|---|---|---|
| Example 9 | amorphous silicon nitride | 782 | 1.28 | 2.60 | 0.100 | 5.5 | 0.5 | 14.3 | 3.01 | 1.82 |
| Example 10 | amorphous silicon nitride | 782 | 1.28 | 2.85 | 0.100 | 6.0 | 0.5 | 13.7 | 2.87 | 1.70 |
| Example 11 | amorphous silicon nitride | 782 | 1.28 | 3.10 | 0.100 | 6.5 | 0.5 | 13.6 | 2.83 | 1.68 |
| Example 12 | amorphous silicon nitride | 782 | 1.28 | 3.35 | 0.100 | 7.0 | 0.5 | 14.2 | 3.00 | 1.86 |
| Example 13 | crystalline silicon nitride | 28.5 | 0.96 | 2.00 | 0.200 | 4.6 | 0.0 | 13.5 | 2.43 | 2.43 |
| Example 14 | crystalline silicon nitride | 14.0 | 0.90 | 2.00 | 0.200 | 4.6 | 0.0 | 12.7 | 2.18 | 2.18 |
| Example 15 | crystalline silicon nitride | 10.0 | 0.89 | 2.00 | 0.200 | 4.6 | 0.0 | 12.7 | 2.01 | 2.01 |
| Example 16 | crystalline silicon nitride | 5.1 | 0.63 | 2.00 | 0.200 | 4.6 | 0.0 | 13.0 | 2.22 | 2.22 |
| Example 17 | crystalline silicon nitride | 0.86 | 0.34 | 2.00 | 0.200 | 4.6 | 0.0 | 14.3 | 1.53 | 1.53 |
| Example 18 | crystalline silicon nitride | 0.29 | 0.29 | 2.00 | 0.200 | 4.6 | 0.0 | 15.2 | 1.42 | 1.42 |
| Example 19 | amorphous silicon nitride | 782 | 1.28 | 2.00 | 0.200 | 4.6 | 0.0 | 14.1 | 3.47 | 3.47 |
| Example 20 | crystalline silicon nitride | 28.5 | 0.96 | 2.00 | 0.200 | 4.6 | 0.0 | 13.5 | 3.28 | 3.28 |
| Example 21 | crystalline silicon nitride | 14.0 | 0.90 | 2.00 | 0.200 | 4.6 | 0.0 | 12.7 | 2.98 | 2.98 |
| Example 22 | crystalline silicon nitride | 10.0 | 0.89 | 2.00 | 0.200 | 4.6 | 0.0 | 12.7 | 2.77 | 2.77 |
| Example 23 | crystalline silicon nitride | 5.1 | 0.63 | 2.00 | 0.200 | 4.6 | 0.0 | 13.3 | 2.45 | 2.45 |
| Example 24 | crystalline silicon nitride | 0.86 | 0.34 | 2.00 | 0.200 | 4.6 | 0.0 | 14.3 | 2.26 | 2.26 |
| Example 25 | crystalline silicon nitride | 0.29 | 0.29 | 2.00 | 0.200 | 4.6 | 0.0 | 15.1 | 2.12 | 2.12 |
| Example 26 | amorphous silicon nitride | 782 | 1.28 | 2.00 | 0.200 | 4.6 | 0.0 | 14.8 | 7.83 | 7.83 |
| Example 27 | crystalline silicon nitride | 28.5 | 0.96 | 2.00 | 0.200 | 4.6 | 0.0 | 15.3 | 7.63 | 7.63 |
| Example 28 | crystalline silicon nitride | 14.0 | 0.90 | 2.00 | 0.200 | 4.6 | 0.0 | 14.7 | 7.18 | 7.18 |
| Example 29 | crystalline silicon nitride | 10.0 | 0.89 | 2.00 | 0.200 | 4.6 | 0.0 | 14.7 | 6.71 | 6.71 |
| Example 30 | crystalline silicon nitride | 5.1 | 0.63 | 2.00 | 0.200 | 4.6 | 0.0 | 15.7 | 6.63 | 6.63 |
| Example 31 | crystalline silicon nitride | 0.86 | 0.34 | 2.00 | 0.200 | 4.6 | 0.0 | 14.6 | 6.43 | 6.43 |
| Example 32 | crystalline silicon nitride | 0.29 | 0.29 | 2.00 | 0.200 | 4.6 | 0.0 | 14.9 | 5.72 | 5.72 |
| Example 33 | amorphous silicon nitride | 782 | 1.28 | 2.00 | 0.200 | 4.6 | 0.0 | 14.2 | 11.32 | 11.32 |
| Example 34 | crystalline silicon nitride | 28.5 | 0.96 | 2.00 | 0.200 | 4.6 | 0.0 | 13.5 | 11.23 | 11.23 |
| Example 35 | crystalline silicon nitride | 14.0 | 0.90 | 2.00 | 0.200 | 4.6 | 0.0 | 12.7 | 10.78 | 10.78 |
| Example 36 | crystalline silicon nitride | 10.0 | 0.89 | 2.00 | 0.200 | 4.6 | 0.0 | 12.7 | 10.31 | 10.31 |
| Example 37 | crystalline silicon nitride | 5.1 | 0.63 | 2.00 | 0.200 | 4.6 | 0.0 | 12.7 | 9.95 | 9.95 |
| Example 38 | crystalline silicon nitride | 0.86 | 0.34 | 2.00 | 0.200 | 4.6 | 0.0 | 14.3 | 10.23 | 10.23 |
| Example 39 | crystalline silicon nitride | 0.29 | 0.29 | 2.00 | 0.200 | 4.6 | 0.0 | 15.5 | 9.42 | 9.42 |
| Comparative Example 1 | amorphous silicon nitride | 782 | 1.28 | 0.48 | 0.015 | 1.0 | 0.3 | 12.8 | 2.78 | 1.95 |
| Comparative Example 2 | amorphous silicon nitride | 782 | 1.28 | 0.98 | 0.015 | 2.0 | 0.3 | 15.6 | 2.68 | 1.88 |
| Comparative Example 3 | amorphous silicon nitride | 782 | 1.28 | 1.38 | 0.015 | 2.8 | 0.3 | 13.8 | 2.73 | 1.95 |
| Comparative Example 4 | amorphous silicon nitride | 782 | 1.28 | 0.23 | 0.015 | 0.5 | 0.5 | 14.2 | 2.90 | 1.50 |
| Comparative Example 5 | amorphous silicon nitride | 782 | 1.28 | 0.41 | 0.060 | 1.0 | 1.0 | 12.9 | 3.42 | 0.69 |
| Comparative Example 6 | amorphous silicon nitride | 782 | 1.28 | 0.70 | 0.015 | 1.5 | 1.0 | 13.1 | 3.46 | 0.75 |

TABLE 1-continued

| | Silicon Raw Material | SSA [m²/g] | Oxygen Concentration of Silicon Raw Material [mass %] | x1 | x2 | y | z | Average Particle Diameter $D_{50}$ [nm] | Oxygen Content [mass %] | Incremental Oxygen Amount* [mass %] |
|---|---|---|---|---|---|---|---|---|---|---|
| Comparative Example 7 | amorphous silicon nitride | 782 | 1.28 | 0.98 | 0.015 | 2.0 | 1.0 | 14.7 | 3.33 | 0.67 |
| Comparative Example 8 | amorphous silicon nitride | 782 | 1.28 | 1.23 | 0.015 | 2.5 | 1.0 | 13.5 | 3.41 | 0.79 |
| Comparative Example 9 | amorphous silicon nitride | 782 | 1.28 | 0.48 | 0.015 | 1.0 | 4.0 | 14.2 | 10.97 | 0.03 |
| Comparative Example 10 | amorphous silicon nitride | 782 | 1.28 | 1.23 | 0.015 | 2.5 | 3.0 | 12.9 | 7.91 | 0.07 |
| Comparative Example 11 | amorphous silicon nitride | 782 | 1.28 | 1.98 | 0.015 | 4.0 | 3.0 | 13.5 | 7.50 | 0.01 |
| Comparative Example 12 | amorphous silicon nitride | 782 | 1.28 | 2.98 | 0.015 | 6.0 | 1.5 | 13.3 | 3.81 | 0.27 |
| Comparative Example 13 | amorphous silicon nitride | 782 | 1.28 | 3.73 | 0.015 | 7.5 | 0.0 | 13.8 | 2.11 | 2.11 |

*Incremental oxygen amount of measured oxygen relative to the theoretical oxygen amount calculated from composition formula.

TABLE 2

| | Crystal Phase | Relative Density [%] | Peak Wavelength [nm] | Conversion Efficiency [lm/mW] |
|---|---|---|---|---|
| Example 1 | α-SiAlON + AlN | 98.3 | 602 | 0.132 |
| Example 2 | α-SiAlON + AlN | 98.1 | 603 | 0.140 |
| Example 3 | α-SiAlON + AlN | 99.2 | 600 | 0.136 |
| Example 4 | α-SiAlON + AlN | 99.1 | 601 | 0.139 |
| Example 5 | α-SiAlON + AlN | 99.2 | 598 | 0.136 |
| Example 6 | α-SiAlON + AlN | 99.0 | 599 | 0.139 |
| Example 7 | α-SiAlON | 100.0 | 594 | 0.121 |
| Example 8 | α-SiAlON + AlN | 99.5 | 598 | 0.135 |
| Example 9 | α-SiAlON + AlN | 98.6 | 603 | 0.140 |
| Example 10 | α-SiAlON + AlN | 98.5 | 605 | 0.128 |
| Example 11 | α-SiAlON + AlN | 98.7 | 605 | 0.133 |
| Example 12 | α-SiAlON + AlN | 98.0 | 607 | 0.123 |
| Example 13 | α-SiAlON + AlN | 99.3 | 603 | 0.134 |
| Example 14 | α-SiAlON + AlN | 98.1 | 603 | 0.129 |
| Example 15 | α-SiAlON + AlN | 97.9 | 603 | 0.127 |
| Example 16 | α-SiAlON + AlN | 97.8 | 603 | 0.122 |
| Example 17 | α-SiAlON + AlN | 97.3 | 603 | 0.121 |
| Example 18 | α-SiAlON + AlN | 95.2 | 603 | 0.114 |
| Example 19 | α-SiAlON + AlN | 99.7 | 603 | 0.153 |
| Example 20 | α-SiAlON + AlN | 100.0 | 603 | 0.149 |
| Example 21 | α-SiAlON + AlN | 98.8 | 603 | 0.144 |
| Example 22 | α-SiAlON + AlN | 98.6 | 603 | 0.142 |
| Example 23 | α-SiAlON + AlN | 98.3 | 603 | 0.138 |
| Example 24 | α-SiAlON + AlN | 97.9 | 603 | 0.136 |
| Example 25 | α-SiAlON + AlN | 95.8 | 603 | 0.127 |
| Example 26 | α-SiAlON + AlN | 100.0 | 600 | 0.130 |
| Example 27 | α-SiAlON + AlN | 100.0 | 601 | 0.129 |
| Example 28 | α-SiAlON + AlN | 99.3 | 601 | 0.130 |
| Example 29 | α-SiAlON + AlN | 99.1 | 602 | 0.128 |
| Example 30 | α-SiAlON + AlN | 98.9 | 602 | 0.126 |
| Example 31 | α-SiAlON + AlN | 98.6 | 602 | 0.126 |
| Example 32 | α-SiAlON + AlN | 96.6 | 602 | 0.126 |
| Example 33 | α-SiAlON + AlN | 100.0 | 597 | 0.122 |
| Example 34 | α-SiAlON + AlN | 100.0 | 599 | 0.124 |
| Example 35 | α-SiAlON + AlN | 99.6 | 600 | 0.124 |
| Example 36 | α-SiAlON + AlN | 99.9 | 600 | 0.123 |
| Example 37 | α-SiAlON + AlN | 99.8 | 601 | 0.121 |
| Example 38 | α-SiAlON + AlN | 99.5 | 601 | 0.121 |
| Example 39 | α-SiAlON + AlN | 97.5 | 601 | 0.120 |
| Comparative Example 1 | α-SiAlON | 99.2 | 586 | 0.105 |
| Comparative Example 2 | α-SiAlON | 99.5 | 597 | 0.106 |
| Comparative Example 3 | α-SiAlON | 99.3 | 600 | 0.099 |
| Comparative Example 4 | α-SiAlON + β-SiAlON** | 98.8 | 579 | 0.072 |
| Comparative Example 5 | α-SiAlON | 99.6 | 598 | 0.110 |
| Comparative Example 6 | α-SiAlON | 99.8 | 581 | 0.106 |
| Comparative Example 7 | α-SiAlON | 99.8 | 588 | 0.112 |
| Comparative Example 8 | α-SiAlON | 100.0 | 592 | 0.114 |
| Comparative Example 9 | α-SiAlON + AlN + AlON*** | 100.0 | 585 | 0.059 |
| Comparative Example 10 | α-SiAlON + AlN | 100.0 | 588 | 0.060 |
| Comparative Example 11 | α-SiAlON + AlN | 100.0 | 592 | 0.069 |
| Comparative Example 12 | α-SiAlON + AlN | 98.2 | 599 | 0.077 |
| Comparative Example 13 | α-SiAlON + AlN | 98.0 | 603 | 0.075 |

**28 mass % of β-SiAlON crystal phase is contained
***Aluminum oxynitride crystal phase ($Al_{2.81}O_{3.56}N_{0.44}$)

What is claimed is:

1. A method of producing a wavelength conversion member composed of polycrystalline ceramics, comprising:
   i) mixing a substance serving as a silicon source, a substance serving as an aluminum source, a substance serving as a calcium source, and a substance serving as a europium source,
   ii) firing the obtained mixture to obtain an (oxy)nitride phosphor powder,
   iii) oxidizing the (oxy)nitride phosphor powder obtained in firing step ii), by a heat treatment at 800 to 1,200° C. in an oxygen-containing atmosphere, to obtain an oxynitride phosphor powder, and
   iv) sintering the oxynitride phosphor powder obtained in the firing step iii) to obtain polycrystalline ceramics, said polycrystalline ceramics comprising an α-sialon crystal phase and an aluminum nitride crystal phase, wherein the oxynitride phosphor powder sintered in the step iv) comprises Ca, Eu, Si, Al, N and O with a ratio of said Ca, Eu, Si, Al and N being a ratio of Ca, Eu, Si, Al and N in an (oxy)nitride phosphor represented by composition Formula (1):

$$Ca_{x1}Eu_{x2}Si_{12-(y+z)}Al_{(y+z)}O_zN_{16-z} \quad (1)$$

wherein x1, x2, y and z are
 $0 < x1 \leq 3.40$,
 $0.05 \leq x2 \leq 0.20$,
 $3.5 < y \leq 7.0$, and
 $0 \leq z \leq 1$,
the oxygen content of the oxynitride phosphor powder being in excess of the theoretical oxygen content of the (oxy)nitride phosphor represented by composition Formula (1), the excess oxygen amount being from 1.1 to 11.5 mass % with respect to 100 mass % of the theoretical mass of the (oxy)nitride phosphor represented by composition Formula (1).

2. The method according to claim 1, further comprising preliminarily adjusting the oxygen content in at least one of the substance serving as a silicon source, the substance serving as an aluminum source, the substance serving as a calcium source, and the substance serving as a europium source used in the step i), which constitute the mixture, wherein the composition of the mixture is such that the oxynitride phosphor powder obtained by firing the mixture in an inert atmosphere has a composition wherein the oxygen content thereof is in excess of the theoretical oxygen amount of the (oxynitride phosphor represented by composition Formula (1).

3. The method according to claim 1, wherein x1, x2, y and z are
 $0 < x1 \leq 3.40$,
 $0.05 \leq x2 \leq 0.20$,
 $4.0 \leq y \leq 6.5$, and
 $0 \leq z \leq 1$.

4. The method according to claim 1, wherein the oxygen content in excess of the theoretical oxygen amount of Formula (1) is 4 mass % or less based on the theoretical mass of the oxynitride phosphor.

5. The method according to claim 1, wherein the oxygen content of the oxynitride phosphor powder is more than 1.4 mass % and less than 5.0 mass % based on the theoretical mass of the oxynitride phosphor represented by Formula (1).

6. The method according to claim 1, wherein the substance serving as a silicon source is an amorphous silicon nitride.

7. The method according to claim 1, wherein the substance serving as a silicon source is a crystalline silicon nitride having a specific surface area of 9 m²/g or more.

8. An oxynitride phosphor powder for production of a wavelength conversion member composed of a sintered polycrystalline ceramic body, wherein the oxynitride phosphor powder comprises Ca, Eu, Si, Al, N and O with a ratio of said Ca, Eu, Si, Al and N being a ratio of Ca, Eu, Si, Al and N in an (oxy)nitride phosphor represented by composition Formula (1):

$$Ca_{x1}Eu_{x2}Si_{12-(y+z)}Al_{(y+z)}O_zN_{16-z} \quad (1)$$

wherein x1, x2, y and z are
 $0 < x1 \leq 3.40$,
 $0.05 \leq x2 \leq 0.20$,
 $3.5 < y \leq 7.0$, and
 $0 \leq z \leq 1$),
the oxygen content being in excess of the theoretical oxygen content of the (oxy)nitride phosphor represented by Formula (1), the excess oxygen amount being from 2.77 to 11.5 mass % with respect to 100 mass % of the theoretical mass of the (oxy)nitride phosphor represented by composition Formula (1).

9. The oxynitride phosphor powder according to claim 8, wherein the excess oxygen amount is 2.77 to 4.0 mass % with respect to 100 mass % of the theoretical mass of the oxynitride phosphor represented by Formula (1) to be 100 mass %.

10. A wavelength conversion member composed of polycrystalline ceramics obtained by sintering the oxynitride phosphor powder according to claim 8.

11. The wavelength conversion member according to claim 10, wherein x1, x2, y and z are
 $0 < x1 \leq 3.40$,
 $0.05 \leq x2 \leq 0.20$,
 $4.0 \leq y \leq 6.5$, and
 $0 \leq z \leq 1$.

12. The wavelength conversion member according to claim 10, wherein the polycrystalline ceramics contains α-SiAlON and aluminum nitride.

13. The wavelength conversion member according to claim 10, wherein the polycrystalline ceramics has relative density of 95% or more.

14. The wavelength conversion member according to claim 10, wherein the wavelength conversion member converts light of 300 to 500 nm to light having a peak wavelength of 590 to 610 nm.

15. A light-emitting device comprising a semiconductor light-emitting element that emits light at a wavelength of 300 to 500 nm and the polycrystalline ceramics according to claim 10.

* * * * *